United States Patent
New

[19]

[11] Patent Number: 6,020,756
[45] Date of Patent: Feb. 1, 2000

[54] MULTIPLEXER ENHANCED CONFIGURABLE LOGIC BLOCK

[75] Inventor: Bernard J. New, Los Gatos, Calif.

[73] Assignee: Xilinx, Inc., San Jose, Calif.

[21] Appl. No.: 09/034,892

[22] Filed: Mar. 3, 1998

[51] Int. Cl.[7] .............................................. H03K 19/177
[52] U.S. Cl. .............................................. 326/39; 326/37
[58] Field of Search ................................. 326/37–41, 47, 326/104

[56] References Cited

U.S. PATENT DOCUMENTS

| | | | |
|---|---|---|---|
| 5,894,565 | 4/1999 | Furtek et al. | 326/38 |
| 5,942,913 | 8/1999 | Young et al. | 326/41 |

OTHER PUBLICATIONS

"The Programmable Logic Data Book" copyright 1994, pp. 2–5 to 2–102 and 8–105 to 8–115, Xilinx, Inc., 2100 Logic Drive, San Jose, CA 95124.

*Primary Examiner*—Jon Santamauro
*Attorney, Agent, or Firm*—E. Eric Hoffman; Edel M. Young

[57] ABSTRACT

A configurable logic block (CLB) which includes a function generator, carry logic and a first multiplexer. To operate the CLB as a multiplier, the function generator and the carry logic are each coupled to receive a first multiplier bit, a second multiplier bit and a carry signal. The function generator and carry logic are configured to provide a sum signal and a carry signal, respectively, in response to these input signals. The first multiplexer is coupled to receive the sum signal, the first multiplier bit, the second multiplier bit and a logic zero signal. The first multiplexer is controlled to pass a selected one of these signals in response to a first multiplicand bit and a second multiplicand bit. As a result, the CLB effectively creates and adds the partial products which result from multiplying the first and second multiplier bits and the first and second multiplicand bits. The carry logic takes into account the carry result from a less significant position and provides a carry result to a more significant position. The CLB can also operate as a relatively large multiplexer. In the multiplexer mode, the function generator is effectively bypassed in favor of the first multiplexer, which provides a larger multiplexing function than that normally available from the function generator. In another mode, the first multiplexer is effectively bypassed, such that the CLB operates as a conventional CLB.

15 Claims, 13 Drawing Sheets

|   |   |   | X3 | X2 | X1 | X0 |   |
|---|---|---|---|---|---|---|---|
|   |   | * | Y3 | Y2 | Y1 | Y0 |   |
|   |   |   | X3Y0 | X2Y0 | X1Y0 | X0Y0 | ←— 1 |
|   |   | X3Y1 | X2Y1 | X1Y1 | X0Y1 | ---- | ←— 2 |
|   | X3Y2 | X2Y2 | X1Y2 | X0Y2 | ---- | ---- | ←— 3 |
| X3Y3 | X2Y3 | X1Y3 | X1Y3 | ---- | ---- | ---- | ←— 4 |
| P = S7 | S6 | S5 | S4 | S3 | S2 | S1 | S0 |

FIG. 1
(PRIOR ART)

|   |   |   | X3 | X2 | X1 | X0 |
|---|---|---|----|----|----|----|
|   | * |   |    |    | Y1 | Y0 |
|   |   |   | X3Y0 | X2Y0 | X1Y0 | X0Y0 |
|   |   | X3Y1 | X2Y1 | X1Y1 | X0Y1 | ---- |
| P = | SPP5 | SPP4 | SPP3 | SPP2 | SPP1 | SPP0 |

MULTIPLEXER ENHANCED CONFIGURABLE LOGIC BLOCK

BACKGROUND OF THE INVENTION

1. Field of the Invention

The present invention relates to an architecture for a configurable logic block (CLB) of a field programmable gate array (FPGA). More specifically, the present invention relates to a CLB having circuitry which facilitates both multiplication and general purpose multiplexing.

2. Related Art

FIG. 1 is a representation of the binary multiplication of a 4-bit multiplier number X with a 4-bit multiplicand word Y. Multiplier number X includes bits X3, X2, X1 and X0 (X3 being the most significant bit and X0 being the least significant bit). Similarly, multiplicand word Y includes bits Y3, Y2, Y1 and Y0 (Y3 being the most significant bit and Y0 being the least significant bit). Each bit of multiplier number X is multiplied by each bit of multiplicand word Y as illustrated, thereby creating four partial products 1–4. The first partial product 1 includes each bit of multiplier number X multiplied by Y0. The second partial product 2 includes each bit of multiplier number X multiplied by Y1. Before addition of the partial products, the second partial product 2 is shifted left one place with respect to the first partial product 1, thereby providing the appropriate weight to these partial products. Note that in binary arithmetic, the shifting of the second partial product 2 to the left by one place relative to the first partial product 1 is equivalent to multiplying the second partial product 2 by two. This might also be interpreted as the first partial product 1 having been shifted right one place relative to the second partial product 2, and consequently, divided by two. The third and fourth partial products 3 and 4 are created and weighted in a similar manner. The aligned columns of partial products 1–4 are added to create sum bits S7-S0. Sum bits S7-S0 represent the product P of multiplier number X and multiplicand number Y.

Various conventional multiplier circuits are described below. These multiplier circuits are often implemented in field programmable gate arrays (FPGAs). FPGAs typically include an array of configurable logic blocks (CLBs) which are configured to form a desired circuit. It is desirable to minimize the number of CLBs required to implement a multiplier circuit in an FPGA. It is also desirable to minimize the delay path of the multiplier circuit implemented in the FPGA.

FIG. 2 is a circuit diagram of a conventional 4×4 bit multiplier circuit 200 for implementing the multiplication operation illustrated in FIG. 1. Multiplier circuit 200 includes AND gates 201–204, divide-by-two circuits 211–213 and adder circuits 221–223. Each of AND gates 201–204 has a first input terminal which is coupled to receive all of the bits X3–X0 of multiplier number X. The second input terminals of AND gates 201, 202, 203 and 204 are coupled to receive multiplicand bits Y0, Y1, Y2 and Y3, respectively.

The multiplication of two binary bits results in a logic "1" value only if both of the input bits have logic "1" values. A logic "0" value results if either or both of the input bits has a logic "0" value. This is functionally identical to the operation of an AND gate, which can therefore be used to perform the multiplication. As a result, AND gates 201, 202, 203 and 204 provide partial products 1, 2, 3 and 4, respectively.

Adder circuits 221, 222 and 223 sequentially add partial products 1–4, beginning with the least significant partial products. Divide-by-two circuits 211–213 provide the appropriate weighting to partial products 1–4. The AND gate-adder combination (e.g., AND gate 203 and adder 222) is sometimes referred to as a gated adder.

Multiplier circuit 200 disadvantageously requires the use of N gated adder circuits to be cascaded, where N is equal to the number of bits in the multiplicand word Y minus one. As the number of Y bits increases, the delay in creating product P increases linearly.

FIG. 3 is a circuit diagram of another conventional 4×4 bit multiplier circuit 300. Multiplier circuit 300 includes AND gate 301, divide-by-two circuits 311–313, adder circuits 321–323 and multiplexers 331–333. AND gate 301 receives multiplier bits X3-X0 on a first input terminal and multiplicand bit Y0 on a second input terminal. As a result, AND gate 301 provides the first partial product 1 to divide-by-two circuit 311.

The weighted first partial product 1 is provided to the "0" input terminal of multiplexer 331 and to an input terminal of adder 321. The other input terminal of gated adder 321 is coupled to receive bits X3-X0 of multiplier number X. The output terminal of adder 321 is provided to the "1" input terminal of multiplexer 331. The control terminal of multiplexer 331 is coupled to receive multiplicand bit Y1.

If multiplicand bit Y1 has a logic "0" value, multiplexer 331 simply passes the weighted first partial product 1. This result is appropriate because the second partial product 2 will consist of zero values if multiplicand bit Y1 has a logic "0" value.

If multiplicand bit Y1 has a logic "1" value, multiplexer 331 passes the output signals provided by adder 321. These output signals represent the sum of the first partial product 1 and the second partial product 2 when multiplicand bit Y1 has a logic "1" value. Again, this result matches that of the first gated adder in FIG. 2. Thus, the combination of adder 321 and multiplexer 331 is another form of gated adder.

Similar operations are performed by the remaining elements of multiplier circuit 300 to create product P.

Multiplier circuit 300 is typically implemented in an FPGA in a more efficient manner than multiplier circuit 200. This is because both adder 321 and multiplexer 331 of multiplier circuit 300 can typically be implemented in a single CLB, while AND gates 201 and 202 of multiplier circuit 200 cannot be implemented in the same CLB as adder 221. Thus, more CLBs are required to implement multiplier circuit 200 than multiplier circuit 300. However, multiplier circuit 300 still requires N sequential gated adder circuits 321–323, where N is equal to the number of bits in multiplicand word Y minus one.

FIG. 4 is a circuit diagram of yet another conventional multiplier circuit 400, which includes AND gates 401–404, multiply-by-two circuits 411–412, multiply-by-four circuit 413 and adder circuits 421–423. AND gates 401, 402, 403 and 404 are connected to provide partial products 1, 2, 3 and 4, respectively. Adder circuit 421 adds the first partial product 1 and the second partial product 2 (as weighted by multiply-by-two circuit 411). Adder circuit 422 adds the third partial product 3 and the fourth partial product 4 (as weighted by multiply-by-two circuit 412). Adder circuit 423 adds the output of adder circuit 422 to the output of adder circuit 421 (as weighted by multiply-by-four circuit 413) to provide product P.

Adder circuits 421 and 422 operate in parallel, rather than in series, thereby reducing the total delay of multiplier circuit 400. However, it is relatively inefficient to implement multiplier circuit 400 in an FPGA, since the AND gates 401 and 402 cannot be implemented in the same CLB as adder circuit 421. Multiplier circuit 400 therefore requires a relatively large number of CLBs to implement.

FIG. 5 is a circuit diagram of yet another conventional multiplier circuit 500. Multiplier circuit 500 is similar to multiplier circuit 400 (FIG. 4). Thus, similar elements in FIGS. 4 and 5 are labeled with similar reference numbers. Multiplier circuit 500 replaces the AND gate 401 and adder circuit 421 of multiplier circuit 400 with adder circuit 501 and multiplexer 511. Similarly, multiplier circuit 500 replaces AND gate 403 and adder circuit 422 of multiplier circuit 400 with adder circuit 502 and multiplexer 512. Adder circuits 501–502 and multiplexers 511–512 are connected in a manner similar to that previously described in connection with multiplier 300 (FIG. 3). The resulting multiplier circuit 500 provides the same product P, while eliminating the AND gates 401 and 403 of multiplier circuit 400 (FIG. 4). However, multiplier circuit 500 is still somewhat inefficient to implement in an FPGA, since AND gate 402 cannot be implemented in the same CLBs as adder circuit 501 and multiplexer 511, and since AND gate 404 cannot be implemented in the same CLBs as adder circuit 502 and multiplexer 512. Multiplier circuit 500 therefore requires a relatively large number of CLBs to implement.

FIG. 6 is a circuit diagram illustrating the implementation of adder circuit 421 (FIG. 4) in an FPGA. Adder circuit 421 is implemented by three CLBs 601–603 of the FPGA. Configurable logic blocks 601–603 include F function generators 611–613, G function generators 621–623, F carry logic circuits 631–633 and G carry logic circuits 641–643. Each configurable logic block includes an F function generator, a G function generator, an F carry logic circuit and a G carry logic circuit as illustrated. The first and second partial products 1 and 2 (i.e., X0Y0, X1Y0, X2Y0, X3Y0, and X0Y1, X1Y1, X2Y1, X3Y1) are created by AND gates (e.g., AND gates 403 and 404 of FIG. 4) in CLBs which are external to CLBs 601–603. The first and second partial products 1 and 2 are applied to function generators 611–613 and 621–622 and carry logic circuits 631–633 and 641–642 as illustrated. The illustrated routing of the partial products 1 and 2, along with the "0" values provided to function generators 611 and 613 and carry logic circuits 631 and 633, provide the appropriate weighting to the first and second partial products. In an optimized implementation, F carry logic circuit 631 is not used because its output is always 0, and function generator 611 is not used because input term $X_0Y_0$ is the final product $SPP_0$.

The logic within each function generator/carry logic circuit pair is configured to generate a sum signal and carry signal in response to the three received input signals. For example, F function generator 612 generates a sum signal $SPP_2$ and F carry logic circuit 632 generates a carry signal $C_3$ in response to the three input signals X1Y1, X2Y0 and $C_2$.

Function generators 611–613 and 621–623 provide output signals $SPP_0$, $SPP_1$, $SPP_2$, $SPP_3$, $SPP_4$ and $SPP_5$. These output signals represent the sum of the first and second partial products.

As previously described, the first and second partial products 1 and 2 must be generated by CLBs which are external to CLBs 601–603. As a result, a relatively large number of CLBs are required to implement the gated adder circuit comprising adder 421 and AND gates 401–402 of FIG. 4. This inefficient use of FPGA resources exists for every gated adder circuit of the multiplier circuit. As a result, multiplier circuits cannot be implemented efficiently in conventional CLBs of an FPGA.

Note that each of the F and G function generators 611–613 and 621–623 is typically capable of implementing a multiplexer as well as an adder circuit. For example, F function generator 611 is typically capable of implementing adder circuit 501 and multiplexer 511 of multiplier circuit 500 (FIG. 5). However, AND gates 411, 412 must still be implemented in separate CLBs.

It would therefore be desirable to have an FPGA with CLBs which are capable of efficiently performing multiplication operations. It would also be desirable if such CLBs were capable of efficiently performing other operations, such as multiplexing, when not performing multiplication operations.

SUMMARY

Accordingly, the present invention provides a configurable logic block (CLB) which includes a function generator, carry logic, and a relatively large (e.g., 4-to-1) multiplexer. To operate the CLB as a multiplier, the function generator and the carry logic are each coupled to receive a first multiplier bit, a second multiplier bit and a carry input signal. The function generator and carry logic are configured to provide a sum signal and a carry output signal, respectively, in response to the first and second multiplier bits and the carry input signal. The 4-to-1 multiplexer is coupled to receive the sum signal, the first multiplier bit, the second multiplier bit and a logic zero signal. The 4-to-1 multiplexer is controlled to pass a selected one of these signals in response to a first multiplicand bit and a second multiplicand bit. More specifically, the 4-to-1 multiplexer passes the sum signal if the first and second multiplicand bits have logic "1" values. If the first multiplicand bit has a logic "1" value and the second multiplicand bit has a logic "0" value, then the 4-to-1 multiplexer passes the second multiplier bit. If the first multiplicand bit has a logic "0" value and the second multiplicand bit has a logic "1" value, then the 4-to-1 multiplexer passes the first multiplier bit. Finally, if both the first and second multiplicand bits have logic "0" values, the 4-to-1 multiplexer passes a logic "0" signal. As a result, the CLB effectively creates and adds the partial products which result from multiplying the first and second multiplier bits with the first and second multiplicand bits. The carry input signal allows both the function generator and the carry logic to take into account the carry result from a less significant position. The carry logic provides the appropriate carry result to the next most significant position.

When the CLB is not programmed to operate as a multiplier, the CLB can be programmed to operate as a relatively large multiplexer. At this time, the 4-to-1 multiplexer is coupled to receive four separate input signals from the input terminals of the CLB. The 4-to-1 multiplexer passes one of these three input signals in response to a pair of control signals provided to the CLB. The function generator is effectively bypassed when the CLB is operated as a 4-to-1 multiplexer. In this mode, the CLB is able to implement a multiplexing function larger than that normally available from the function generator.

When the CLB is not programmed to operate as a multiplier or a multiplexer, the 4-to-1 multiplexer can be effectively bypassed, thereby allowing the CLB to operate as a conventional CLB.

The present invention will be more fully understood in view of the following description and drawings.

BRIEF DESCRIPTION OF THE DRAWINGS

FIG. 1 is a schematic representation of the binary multiplication of a 4-bit multiplier number X with a 4-bit multiplicand word Y;

FIG. 11 is a schematic representation of the multiplication operation performed by the multiplier of FIG. 10.

DETAILED DESCRIPTION

Figure 7:
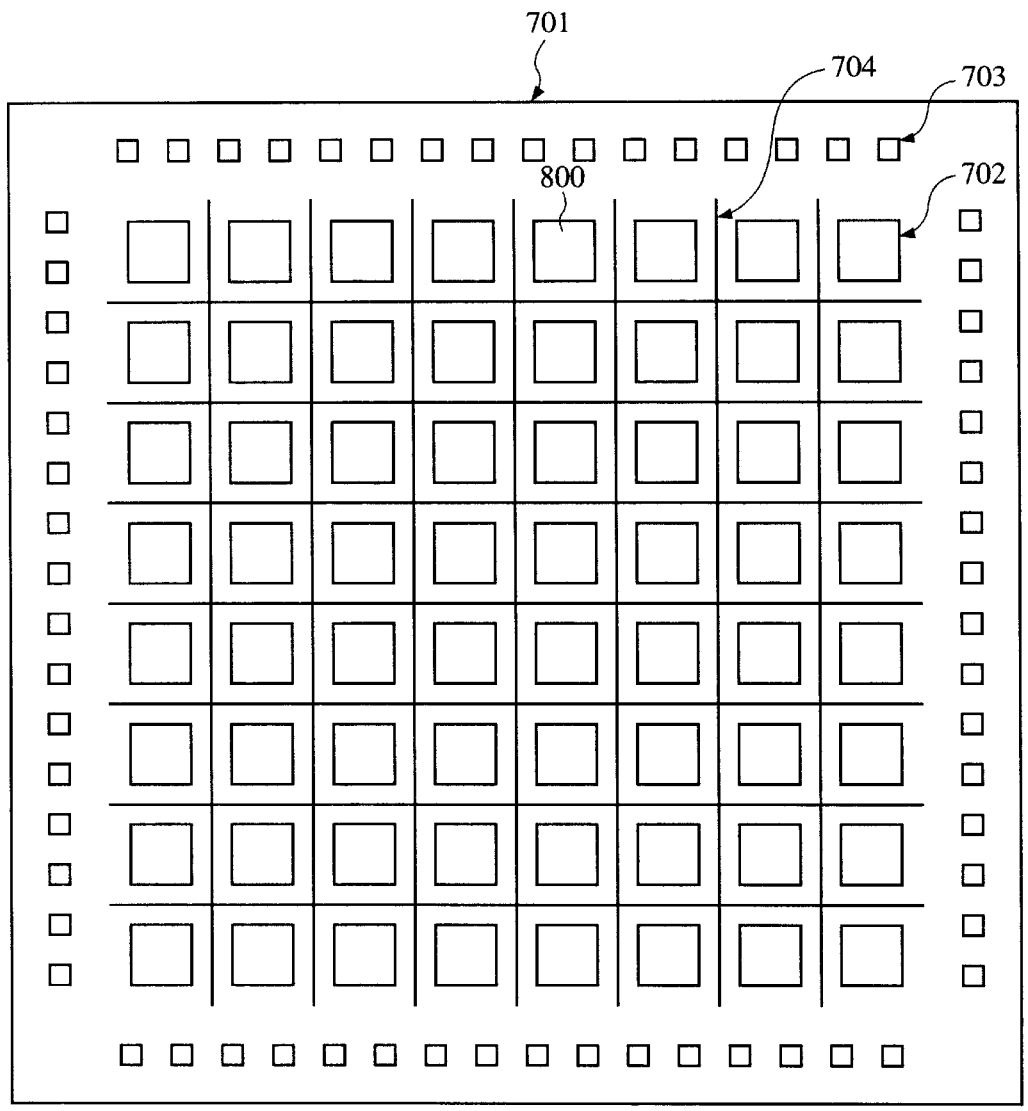
FIG. 7 is a block diagram of a field programmable gate array (FPGA)

FIG. 7 is a block diagram of a field programmable gate array (FPGA) 701 which includes a centrally located array 702 of configurable logic blocks (CLBs), which includes CLB 800, and a plurality of programmable input/output blocks (IOBs) 703 located around the perimeter of the FPGA 701. Programmable interconnect resources 704 are located within the CLB array 702, and extend between the CLB array 702 and the IOBs 703. In general, the CLB array 702 provides the functional elements for constructing a logic circuit. The IOBs 703 provide an interface between the external pins of the FPGA 701 and the logic circuit implemented by the CLB array 702. The programmable interconnect resources 704 provide routing paths to connect the CLBs 702 and IOBs 703 into the desired networks. Customized configuration of the FPGA 701 is achieved by programming internal static configuration memory cells that determine the logic functions and interconnections of the CLBs 702, IOBs 703 and programmable interconnect resources 704.

Figure 8:
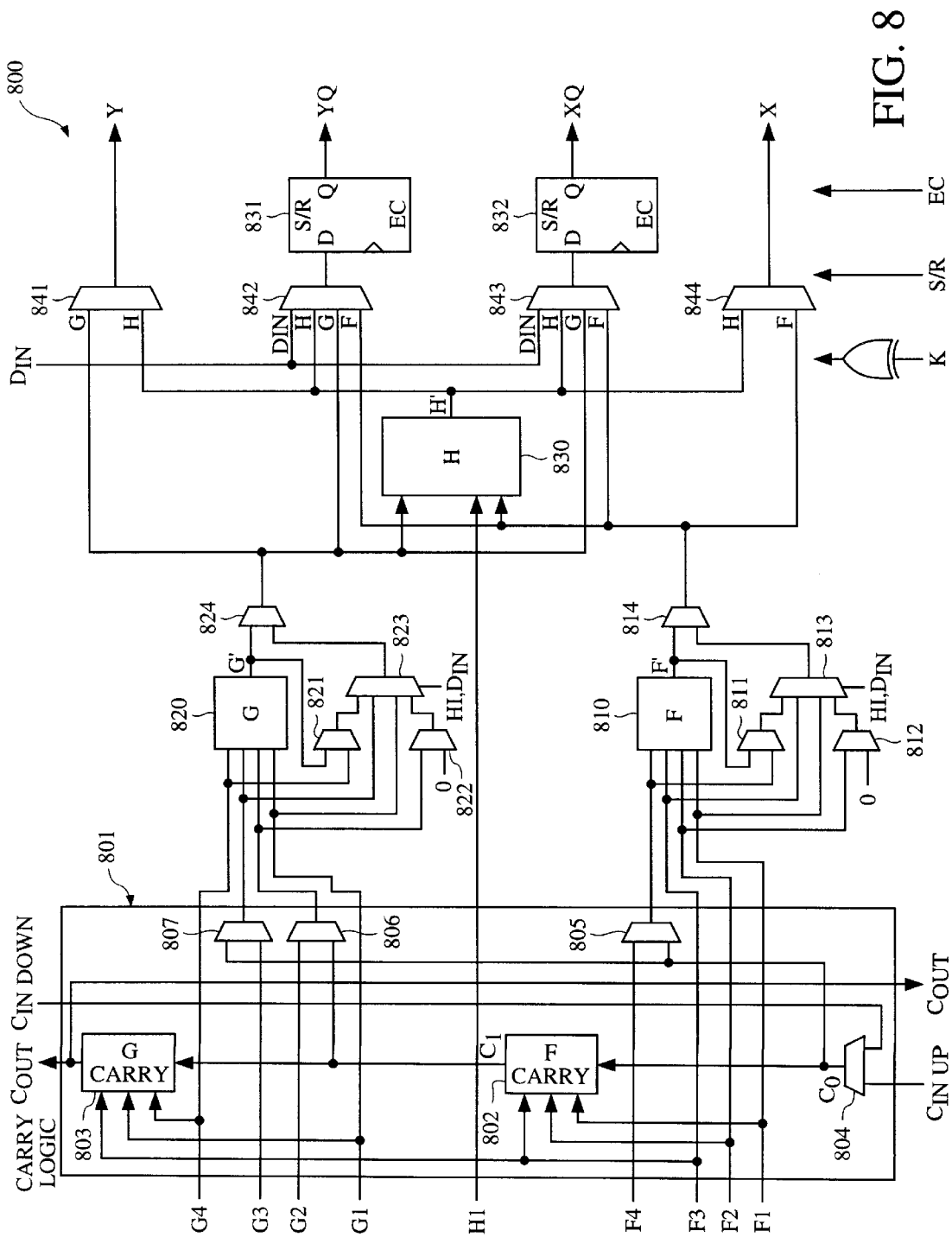
FIG. 8 is a schematic diagram of configurable logic block in accordance with one embodiment of the present invention.

FIG. 8 is a schematic diagram of configurable logic block 800 in accordance with one embodiment of the present invention. CLB 800 includes carry logic 801, F function generator 810, G function generator 820, H function generator 830, flip flops 831–832 and multiplexers 811–824, 821–824 and 841–844. Carry logic 801 includes F carry logic 802, G carry logic 803 and multiplexers 804–807.

CLB 800 receives input signals F1–F4, G1–G4, H1, K (clock), S/R (set/reset), EC (enable clock), $C_{INUP}$ (carry in up) and $C_{IN\,DOWN}$ (carry in down). CLE 800 provides output signals X, Y, XQ, YQ and $C_{OUT}$ (carry out). All of the elements of CLB 800, with the exception of multiplexers 811–814 and 821–824 and their associated connections, are conventional elements which are found in the XC4000 family of FPGAs available from Xilinx, Inc., 2100 Logic Drive, San Jose, Calif. 95124. The XC4000 family is described in more detail in The Programmable Logic Data Book, (1994) pp. 2-5 to 2-102 and 8-105 to 8-115, available from Xilinx (PN0401253), which is hereby incorporated by reference, and in The Programmable Logic Data Book, (1996) pp. 4-1 to 4-178, available from Xilinx (PN 0010303), which is also hereby incorporated by reference.

A general description of the conventional elements of CLB 800 is provided below. In general, the input and output terminals of CLB 800 are connected to the programmable interconnect resources 704 of FPGA 701. Within carry logic 801, multiplexer 804 routes either the $C_{IN\,UP}$ or the $C_{IN\,DOWN}$ signal as carry signal $C_0$. F carry logic 802 receives the F1-F3 input signals and the $C_0$ signal as routed by multiplexer 804. In response, F carry logic 802 provides carry signal $C_1$ to G carry logic 803 and to multiplexer 806. G carry logic 803 also receives the G1, G4 and F3 input signals. In response to these input signals, G carry logic 803 provides the carry output signal $C_{OUT}$.

F function generator 810 receives the F1-F3 input signals and either the F4 input signal or the $C_0$ carry signal as routed by multiplexer 805. In response, F function generator 810 generates an output signal F'. G function generator 820 receives the G1 input signal, the G4 input signal, the G2 input signal or the $C_1$ carry signal as routed by multiplexer 806, and the G3 input signal or the $C_0$ carry signal as routed by multiplexer 807. In response, G function generator 820 generates an output signal G'. Each of function generators 810 and 820 is capable of implementing any arbitrarily defined Boolean function of their four input signals. H Function generator 830 receives input signals F', G' and H1, and in response, provides an output signal H' which can be any Boolean function of these three input signals.

Multiplexers 841–844 are controlled to route the various signals out of the CLB 800 as illustrated. Multiplexers (not shown) are controlled to route the K signal or the inverse of the K signal to the clock input terminals of flip-flops 831 and 832. Similarly, multiplexers (not shown) are controlled to route the EC signal or a default logic '1' value to flip flops 831 and 832. Set/reset signals are provided to flip flops 831 and 832 by control circuits (not shown) which operate in response to the S/R input signal.

The previously described multiplexers, function generators and carry logic circuits are configured by programming configuration memory cells associated with CLB 800, in a manner known to those of ordinary skill in the art.

In addition to the previously described elements, CLB 800 includes multiplexers 811–814 and 821–824. As described in more detail below, these multiplexers can be configured to enable CLB 800 to operate as an efficient multiplier circuit. Alternatively, these multiplexers can be configured to enable CLB 800 to operate as an efficient multiplexer. Finally, these multiplexers can be disabled, thereby enabling CLB 800 to operate as a conventional CLB.

Figure 9:
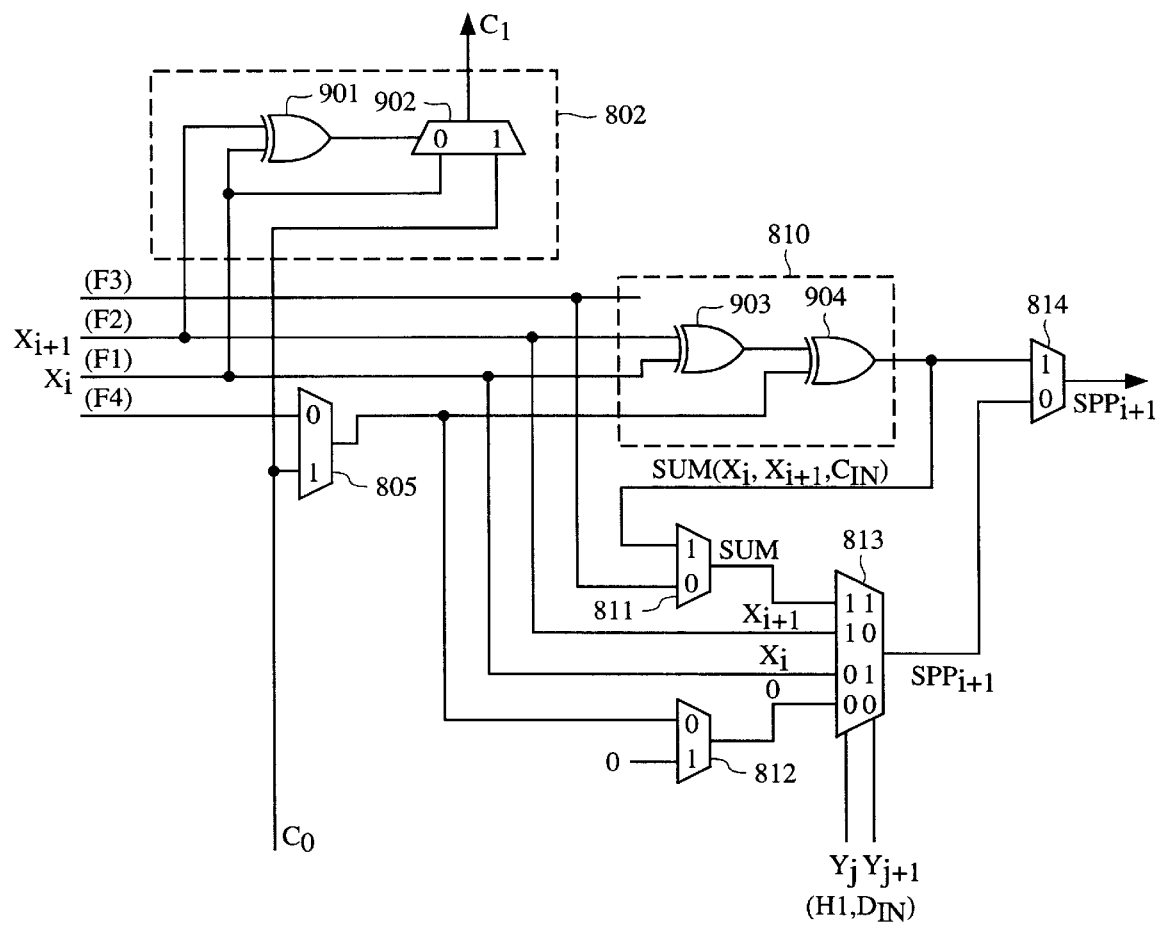
FIG. 9 is a circuit diagram which illustrates a portion of the CLB of FIG. 8 configured to implement a multiplier function in accordance with one embodiment of the present invention.

FIG. 9 is a circuit diagram which illustrates F carry logic 802, multiplexer 805, function generator 810 and multiplexers 811–814 configured to implement a multiplier circuit in accordance with one embodiment of the present invention. In this embodiment, F carry logic 802 is configured to provide exclusive OR gate 901 and multiplexer 902. The input terminals of exclusive OR gate 901 are coupled to receive the F1 and F2 input signals. In the described embodiment, the F1 and F2 input signals are selected to correspond with two bits, $X_i$ and $X_{i+1}$, of a multiplier number X. The output signal provided by exclusive OR gate 901 controls multiplexer 902. The "0" input terminal of multiplexer 902 is coupled to receive the $X_i$ bit, and the "1" input terminal of multiplexer 902 is coupled to receive the $C_0$ carry signal. Multiplexer 902 routes either the $X_i$ bit or the $C_0$ carry signal in response to the output signal provided by exclusive OR gate 901.

When CLB 800 is configured as a multiplier circuit, multiplexer 805 is configured to route the $C_0$ carry signal to F function generator 810. F Function generator 810 is configured to emulate exclusive OR gates 903 and 904 as illustrated. Gate 903 generates the XOR of the $X_i$ and $X_{i+1}$ multiplier bits. Gate 904 generates the XOR of the output signal provided by exclusive OR gate 903 and the $C_0$ carry signal. Thus, exclusive OR gate 904 generates a SUM signal which is provided to the "0" input terminal of multiplexer 814 and the "1" input terminal of multiplexer 811.

When configured as illustrated in FIG. 9, F function generator 810 and F carry logic 802 generate a SUM signal and a carry signal $C_1$, respectively, in response to the $X_i$, $X_{i+1}$ and $C_0$ signals. The results are summarized below in Table 1.

TABLE 1

| $X_i$ | $X_{i+1}$ | $C_0$ | SUM | $C_1$ |
|---|---|---|---|---|
| 0 | 0 | 0 | 0 | 0 |
| 0 | 0 | 1 | 1 | 0 |
| 0 | 1 | 0 | 1 | 0 |
| 0 | 1 | 1 | 0 | 1 |
| 1 | 0 | 0 | 1 | 0 |
| 1 | 0 | 1 | 0 | 1 |
| 1 | 1 | 0 | 0 | 1 |
| 1 | 1 | 1 | 1 | 1 |

Multiplexer 811 is configured to pass the SUM signal (rather than the F3 input signal) to the "11" input terminal of 4-to-1 multiplexer 813. Multiplexer 812 is configured to pass a logic "0" value to the "00" input terminal of 4-to-1 multiplexer 813. The "01" and "10" input terminals of 4-to-1 multiplexer 813 are coupled to receive the $X_i$ and $X_{i+1}$ bits, respectively.

The control terminals of 4-to-1 multiplexer 813 are configured to receive the $Y_j$ and $Y_{j+1}$ input signals on the H1 and DIN input terminals. Additional routing circuitry, not present in a conventional CLB, is provided to achieve this configuration. Although the present embodiment uses the H1 and DIN input terminals to control 4-to-1 multiplexer 813, it is understood that other input terminals to CLB 800 can be used to control 4-to-1 multiplexer 813 in other embodiments.

In the described multiplier embodiment, the H1 and DIN input terminals are connected to receive two bits, $Y_j$ and $Y_{j+1}$, of a multiplicand word Y. Multiplexer 813 passes one of the four input signals (SUM, $X_{i+1}$, $X_i$ and 0) as a "sum of the partial products" output signal ($SPP_{i+1}$) in response to multiplicand bits $Y_j$ and $Y_{j+1}$. Table 2 summarizes the manner in which these input signals are routed by 4-to-1 multiplexer 813.

TABLE 2

| $Y_j$ | $Y_{j+1}$ | $SPP_{i+1}$ |
|---|---|---|
| 0 | 0 | 0 |
| 0 | 1 | $X_i$ |
| 1 | 0 | $X_{i+1}$ |
| 1 | 1 | SUM |

In the described multiplier embodiment, multiplexer 814 is configured to pass the $SPP_{i+1}$ output signal received from 4-to-1 multiplexer 813 as an output signal. The $SPP_{i+1}$ output signal can be routed out of CLB 800 as any one of the output signals X, XQ, Y or YQ by appropriately configuring CLB 800 (FIG. 8).

For the circuit of FIG. 9 to operate as a multiplier, the result must agree with the following arithmetic equation.

$$SPP_{i+1} = \text{modulo2}\{X_i Y_{j+1} + X_{i+1} Y_j + C_0\} \quad (1)$$

If either the $Y_j$ or $Y_{j+1}$ bits has a logic "0" value, the carry signal $C_0$ will necessarily have a logic "0" value. Thus, if both the $Y_j$ and $Y_{j+1}$ multiplicand bits have "0" values, then the expected result of equation (1) is "0". This result is achieved by routing the "0" signal provided by multiplexer 812 through 4-to-1 multiplexer 813 as the $SPP_{i+1}$ output signal.

If the $Y_j$ multiplicand bit has a "0" value and the $Y_{j+1}$ multiplicand bit has a "1" value, then the expected result of equation (1) is $X_i$ (i.e., $(X_i \times 1) + (X_{i+1} \times 0) + 0$). This result is achieved by routing the $X_i$ signal through 4-to-1 multiplexer 813 as the $SPP_{i+1}$ output signal.

If the $Y_j$ multiplicand bit has a "1" value and the $Y_{j+1}$ multiplicand bit has a "0" value, then the expected result of equation (1) is $X_{i+1}$ (i.e., $(X_i \times 0) + (X_{i+1} \times 1) + 0$). This result is achieved by routing the $X_{i+1}$ signal through 4-to-1 multiplexer 813 as the $SPP_{i+1}$ output signal.

Finally, if both the $Y_j$ and $Y_{j+1}$ multiplicand bits in equation (1) have "1" values, then the expected result of equation (1) is $X_i + X_{i+1} + C_0$. This result is achieved by routing the SUM signal provided by multiplexer 811 through 4-to-1 multiplexer 813 as the $SPP_{i+1}$ output signal.

The multiplier circuit illustrated in FIG. 9 can be coupled to other similar multiplier circuits to form a larger multiplier. Because the multiplier circuit of FIG. 9 receives the multiplier and multiplicand bits directly, there is no need for external AND gates. The function of the multiplier circuit of FIG. 9 can be more readily understood in the context of a larger multiplier. Thus, FIG. 10, which includes FIGS. 10A, 10B and 10C, illustrates a 2×4 multiplier which is implemented with three CLBs 800A, 800B and 800C. These CLBs 800A, 800B and 800C are identical to previously described CLB 800. Thus, similar elements in FIGS. 9 and 10 are labeled with similar reference numbers.

Figures 10, 10A:
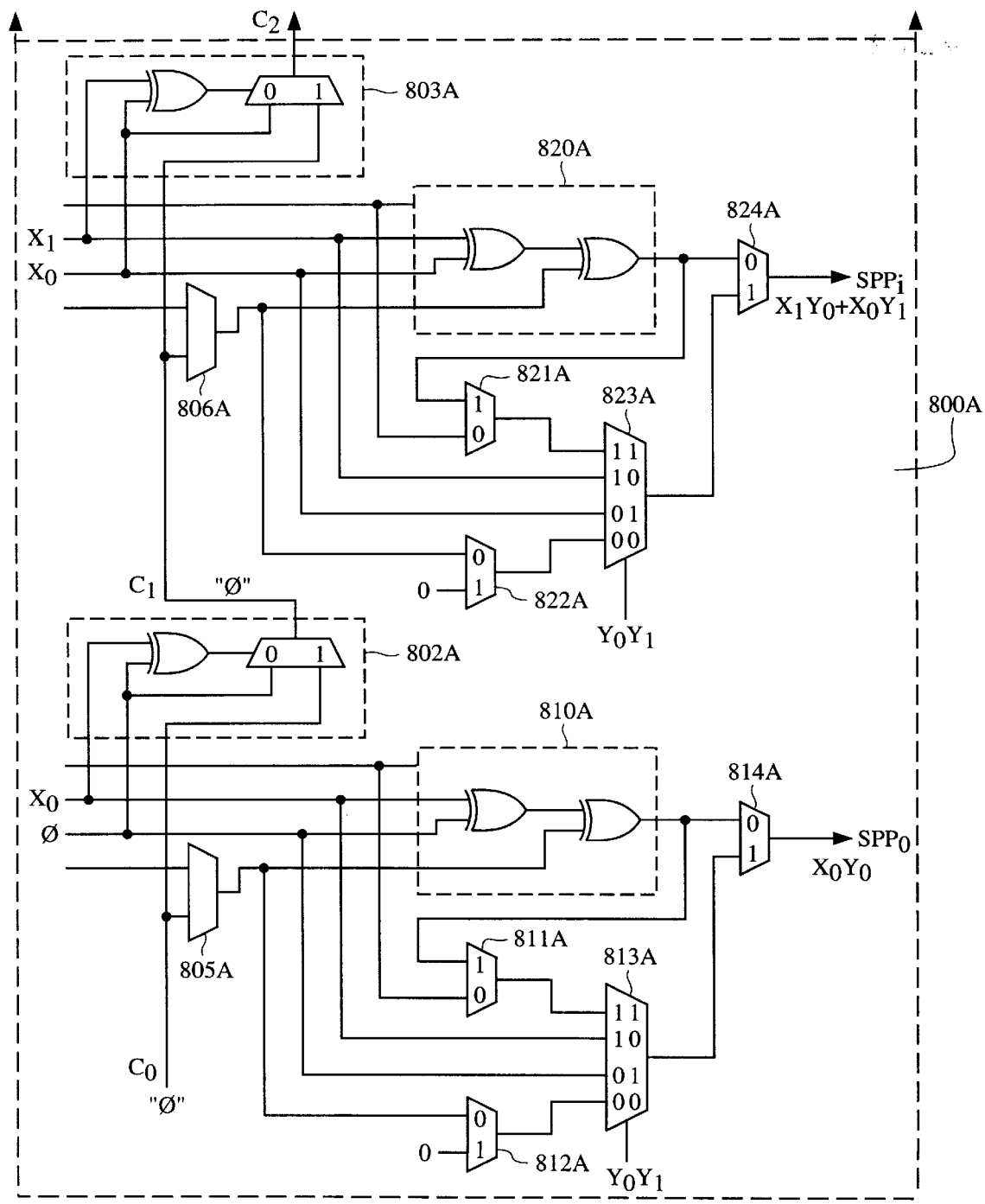
FIG. 10, which includes
FIGS. 10A–10C, illustrates a 2×4 multiplier which is implemented with three CLBs in accordance with the present invention.
Figure 10B:
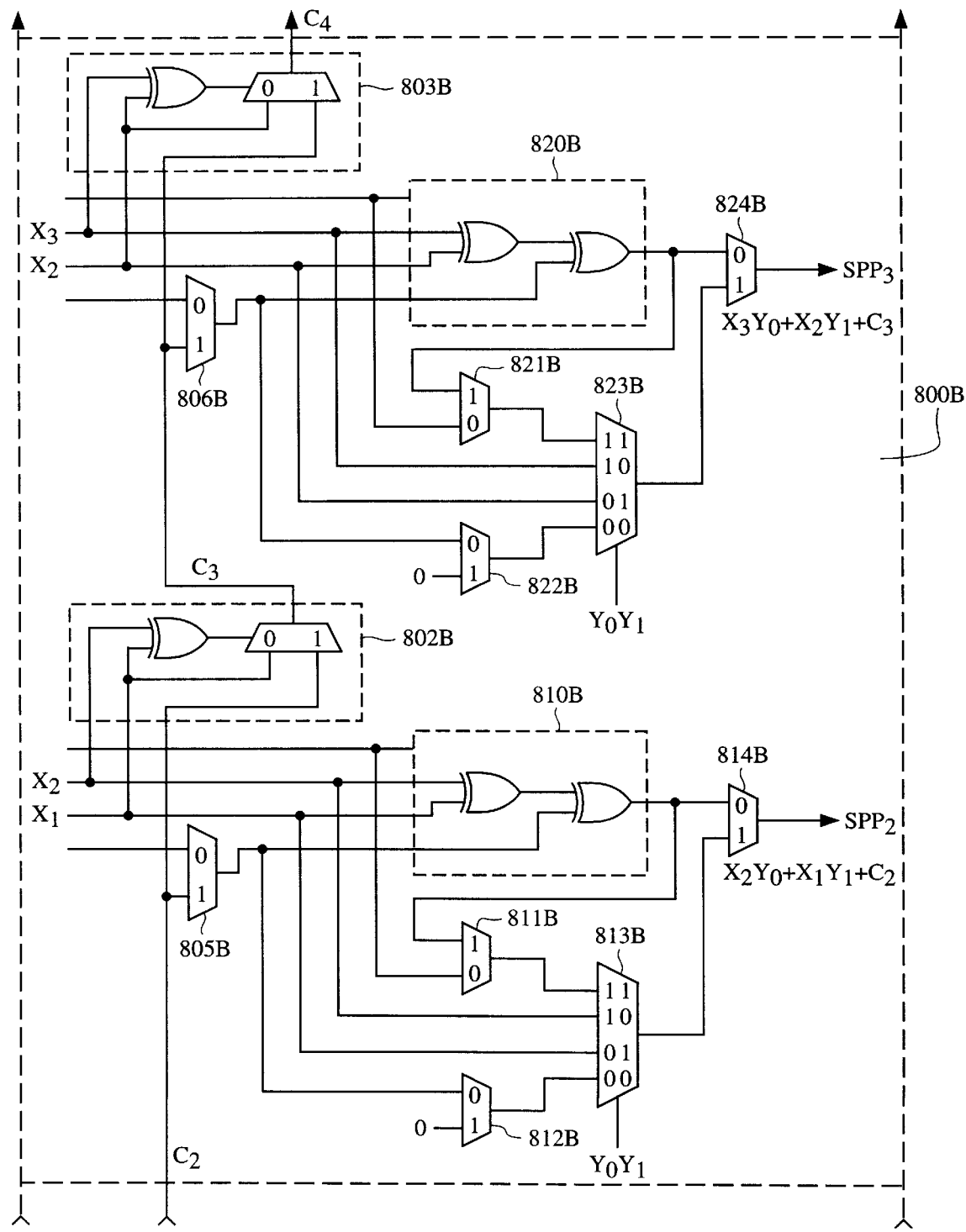
Figure 10C:
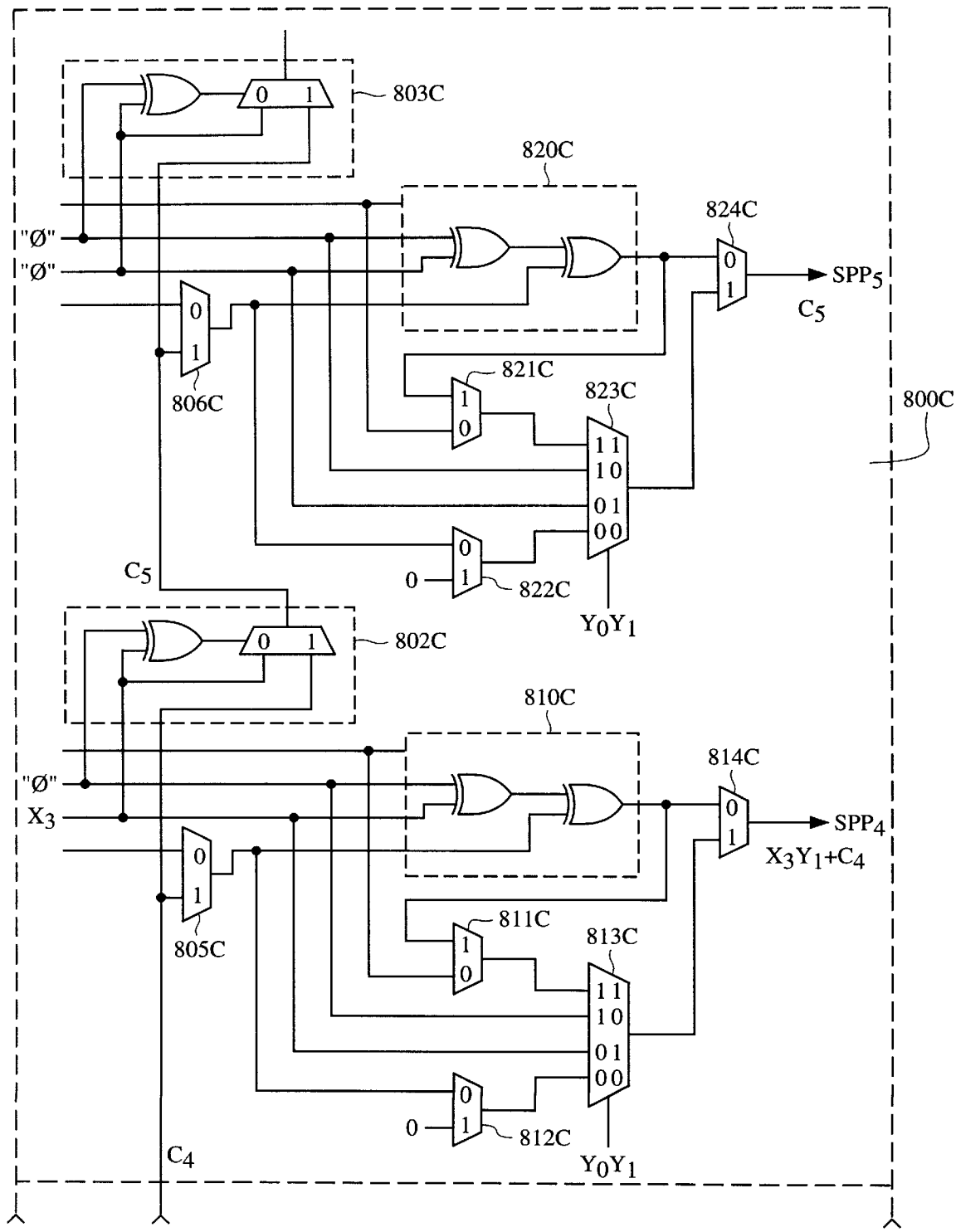

The multiplier of FIG. 10 multiplies a 4-bit multiplier number X (which includes multiplier bits X3, X2, X1 and X0) with a 2-bit multiplicand word Y (which includes multiplicand bits Y1 and Y0). FIG. 11 is a schematic representation of the multiplication operation performed by the multiplier of FIG. 10.

Figure 2:
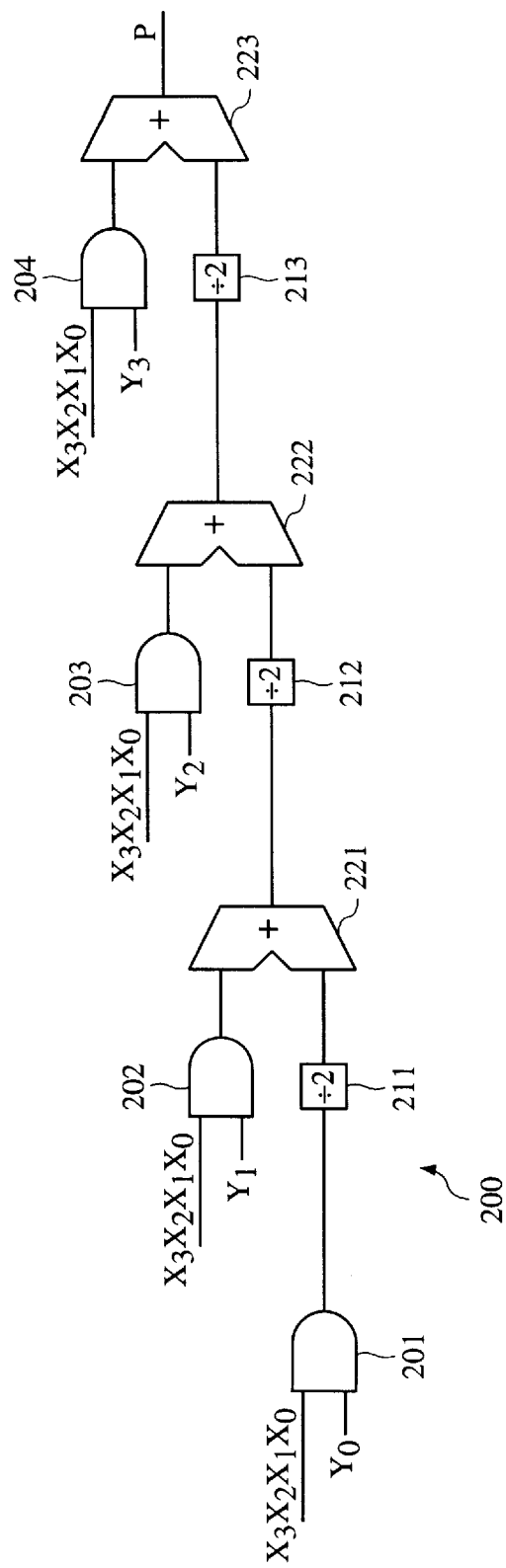
FIG. 2 is a circuit diagram of a conventional 4×4 bit multiplier circuit for implementing the multiplication operation illustrated in FIG. 1.
Figure 3:
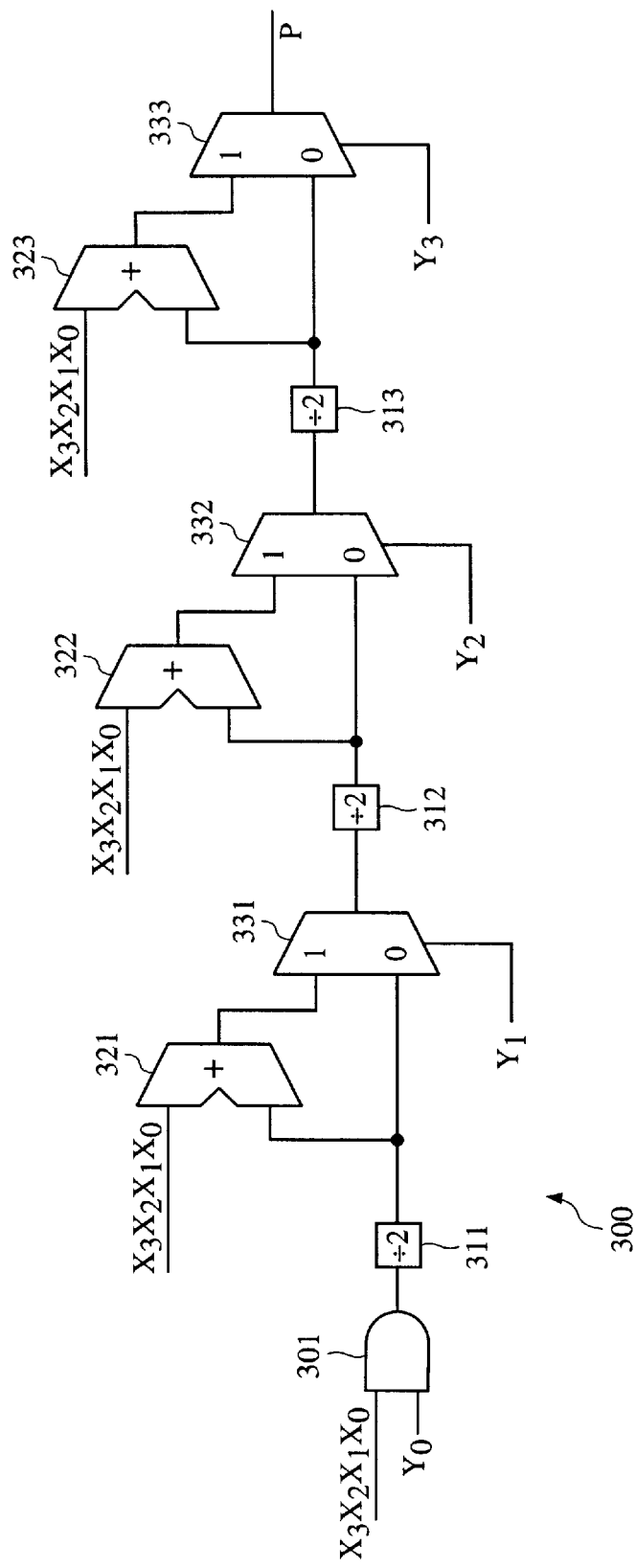
FIGS. 3, 4 and 5 are circuit diagrams of other conventional 4×4 bit multiplier circuits.
Figure 4:
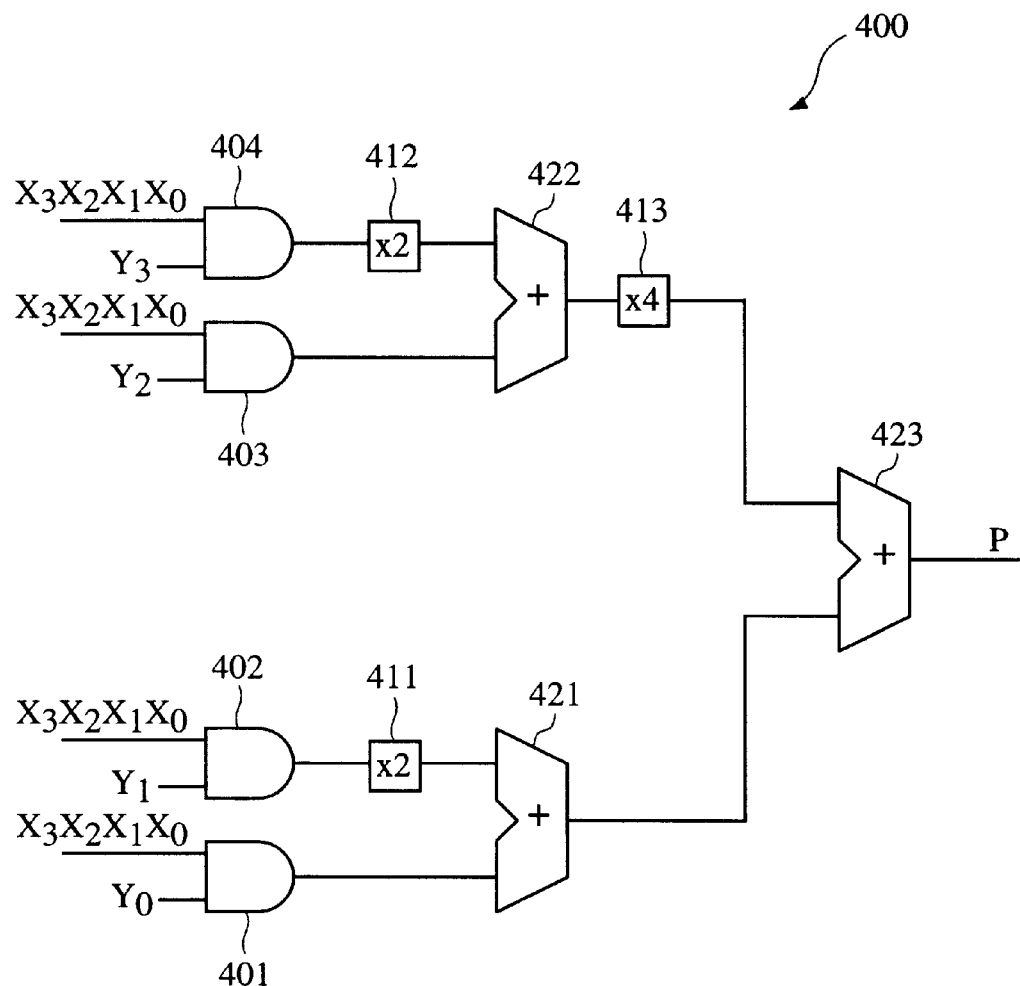
Figure 5:
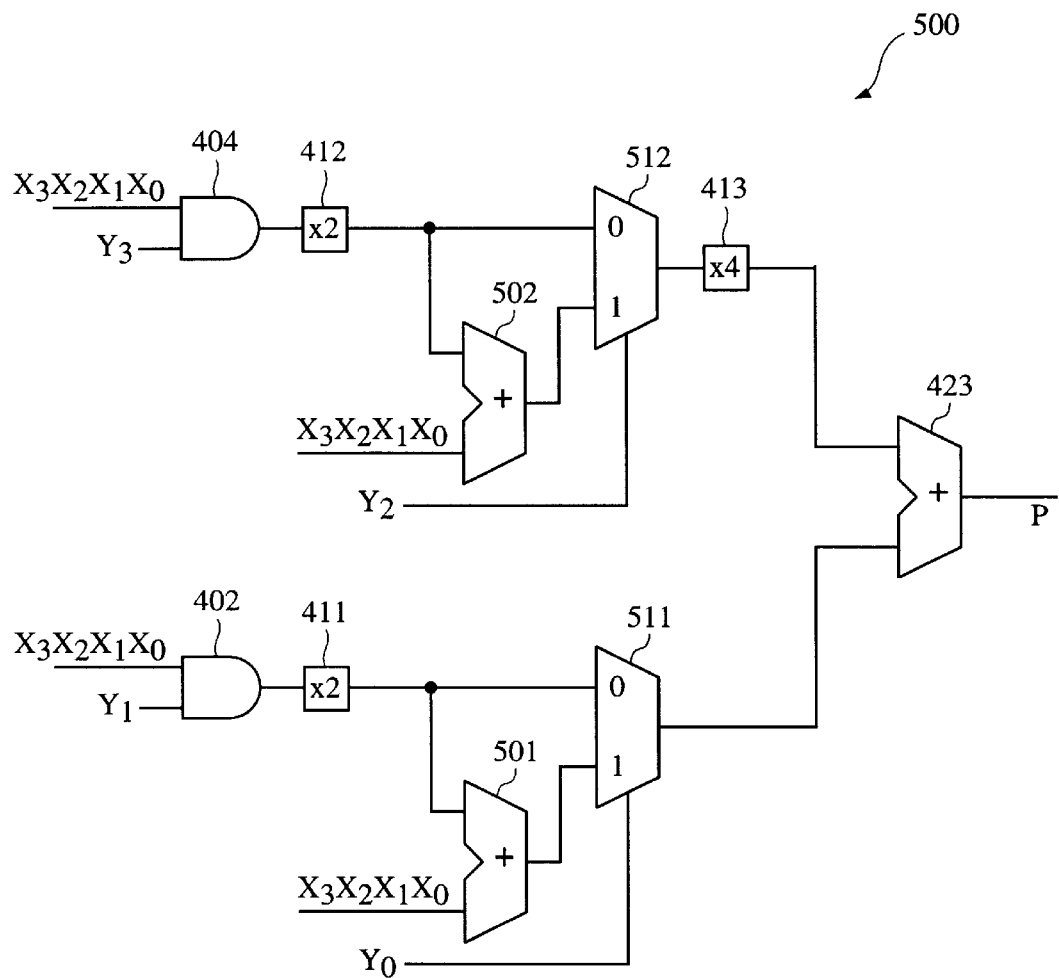
Figure 6:
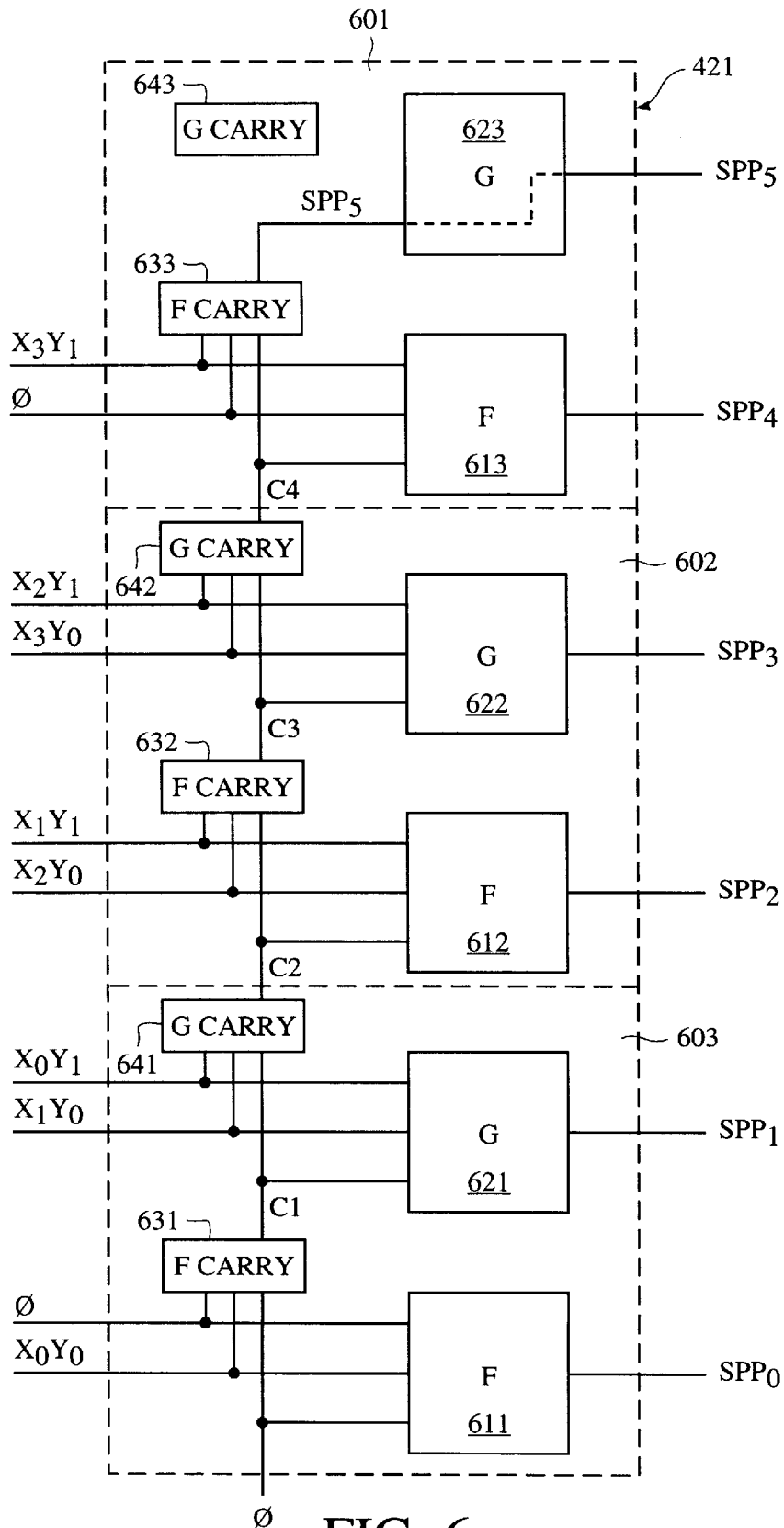
FIG. 6 is a circuit diagram illustrating the conventional implementation of an adder circuit in an FPGA.

For purposes of comparison with the prior art multipliers, the multiplier of FIG. 10 performs the same function as AND gates 201–202, divide-by-two circuit 211 and adder circuit 221 of multiplier 200 (FIG. 2). The multiplier of FIG. 10 also performs the same function as AND gate 301, adder circuit 321, divide-by-two circuit 311 and multiplexer circuit 331 of multiplier 300 (FIG. 3). In addition, the multiplier of FIG. 10 also performs the same function as AND gates 403–404, multiply-by-two circuit 412 and adder circuit 422 of multiplier 400 (FIG. 4). Finally, the multiplier of FIG. 10 performs the same function as AND gate 403, multiply-by-two circuit 412, adder circuit 502 and multiplexer 512 of multiplier 500 (FIG. 5).

Turning now to FIG. 10A, CLB 800A receives multiplier bits X1 and X0 and multiplicand bits Y1 and Y0, and in response, generates an output signal $SPP_0$ which is equal to X0Y0 and an output signal $SPP_1$ which is equal to X1Y0+X0Y1.

More specifically, F function generator 810A and carry logic 802A of CLB 800A are each coupled to receive the X0 multiplier bit, a logic "0" input bit and a logic "0" carry signal $C_0$. The Y0 and Y1 multiplicand bits are provided to control multiplexer 813A. As a result, multiplexer 814A provides an output signal $SPP_0$ equal to Y0X0.

Because two of the input signals to carry logic 802A are logic "0" values, the carry logic 802A provides a logic "0" carry signal $C_1$.

G function generator 820A and carry logic 803A of CLB 800A are coupled to receive the X1 and X0 multiplier bits, as well as the logic "0" carry signal $C_1$. Note that multiplexer 806A is configured to route the logic "0" carry signal $C_1$ from carry logic 802A to G function generator 820A. The Y0 and Y1 multiplicand bits are provided to control multiplexer 823A. As a result, the output signal $SPP_1$ provided by multiplexer 824A is equal to X1Y0+X0Y1. G carry logic 803A provides a carry signal $C_2$ in response to the X1 and X0 multiplier bits and the carry signal $C_1$.

Turning now to FIG. 10B, CLB 800B receives multiplier bits X3, X2 and X1, multiplicand bits Y1 and Y0, and carry signal $C_2$, and in response, generates an output signal $SPP_2$ which is equal to X2Y0+X1Y1+$C_2$ and an output signal $SPP_3$ which is equal to X3Y0+X2Y1+$C_3$ (where $C_3$ is the carry signal generated by carry logic 802B).

More specifically, F function generator 810B and carry logic 802B of CLB 800B are each coupled to receive the X2 and X1 multiplier bits and the carry signal $C_2$ from carry logic 803A. The Y0 and Y1 multiplicand bits are provided to control multiplexer 813B. As a result, the product signal $SPP_2$ provided by multiplexer 814B is equal to X2Y0+ X1Y1+$C_2$. F carry logic 802B provides carry signal $C_3$ in response to the X2 and X1 multiplier bits and the carry signal $C_2$.

G function generator 820B and carry logic 803B of CLB 800B are coupled to receive the X3 and X2 multiplier bits and the carry signal C3 from carry logic 802B. The Y0 and Y1 multiplicand bits are provided to control multiplexer 823B. As a result, the output signal $SPP_3$ provided by multiplexer 824B is equal to X3Y0+X2Y1+$C_3$. G carry logic 803B provides a carry signal $C_4$ in response to the X3 and X2 multiplier bits and the carry signal $C_4$.

Turning now to FIG. 10C, CLB 800C receives multiplier bit X3, multiplicand bits Y1 and Y0, and carry signal $C_4$, and in response, generates an output signal $SPP_4$ which is equal to X3Y1+$C_4$), and an output signal $SPP_5$ which is equal to the carry signal $C_5$ generated by carry logic 802C.

F function generator 810C and carry logic 802C of CLB 800C are coupled to receive a logic "0" input signal, the X3 multiplier bit and the carry signal $C_4$ from carry logic 803B. The Y0 and Y1 multiplicand bits are provided to control multiplexer 813C. As a result, the output signal $SPP_5$ provided by multiplexer 814C is equal to X3Y1+$C_4$. F carry logic 802C provides a carry signal $C_5$ in response to the logic "0" input signal, the X3 multiplier bit and the carry signal $C_4$.

G function generator 820C and carry logic 803C are coupled to receive two logic "0" input signals and carry signal $C_5$. Logic "0" values are provided to control multiplexer 823C. As a result, the output signal $SPP_5$ provided by multiplexer 824C is equal to the carry signal $C_5$.

In the foregoing manner, CLBs 800A–800C generate an output signal $SPP_5$-$SPP_0$ which is equal to the sum of the partial products which result from multiplying multiplier number X3-X0 by multiplicand word Y1-Y0. Although the present invention has been described in accordance with a 2×4 multiplier circuit, 2×N multiplier circuits can similarly be implemented by the present invention, where N is any integer value. Moreover, any M×N multiplier can be realized by expanding the multiplier circuit in a tree-like manner as illustrated in FIG. 4.

When CLB 800 is not being used in a multiplier circuit in the manner previously described, multiplexers 811–814 and 821–824 can be used to perform multiplexing functions. For example, turning again to FIG. 8, multiplexers 811–814 can be programmed to implement a 4-to-1 multiplexer function. In this example, each of the four input terminals F1-F4 is coupled to receive an input signal to be multiplexed. Logic "0" values are provided to the control terminals of multiplexers 811 and 812 by programming the associated configuration memory cells in the appropriate manner. As a result, 4-to-1 multiplexer 813 receives the four input signals applied to input terminals F1–F4. The control terminals of 4-to-1 multiplexer 813 are coupled to receive the desired control signals (e.g., H1 and DIN), thereby causing 4-to-1 multiplexer 813 to pass a selected one of the input signals to the "1" input terminal of multiplexer 814. A logic "1" value is provided to the control terminal of multiplexer 814 by programming the associated configuration memory cell in the appropriate manner, thereby routing the output signal provided by 4-to-1 multiplexer 813 as an output signal.

In a similar manner, multiplexers 821–824 can be configured to implement another 4-to-1 multiplexer which selectively routes the input signals provided on input terminals G1–G4. The control terminals of multiplexer 823 can be coupled to receive control signals which are independent of the control signals provided to multiplexer 813. For example, the control terminals of multiplexer 823 can be coupled to receive the S/R and EC signals as control signals. Alternatively, the control terminals of multiplexer 823 can be coupled to receive the same control signals as multiplexer 813.

In addition, multiplexers 811–814 and 821–824 can be combined to form an 8-to-1 multiplexer. To accomplish this, the control terminals of multiplexers 813 and 823 are coupled to receive the same control signals (e.g., the DIN and S/R input signals). The output signals from multiplexers 813 and 823 are routed to H function generator 830. The H1 input signal is then used to select between these two output signals. The output signal provided by the H function generator is provided as the output signal of the 8-to-1 multiplexer.

If CLB 800 is to operate as neither a multiplier circuit nor a multiplexer, then logic "0" control signals are provided to the control terminals of multiplexers 814 and 824 by programming the associated configuration memory cells in the appropriate manner. As a result, multiplexers 814 and 824 pass the output signals received from function generators 810 and 820, respectively. Multiplexers 811–813 and 821–823 are effectively ignored in this configuration, thereby enabling CLB 800 to operate as a conventional CLB.

Although the invention has been described in connection with several embodiments, it is understood that this invention is not limited to the embodiments disclosed, but is capable of various modifications which would be apparent to a person skilled in the art. Thus, while the invention has been described in connection with a CLB which implements a multiplication function, it is understood that other functions can be implemented using the described structure. Moreover, multiplexer 811 (FIG. 8) can be directly connected to receive the input signal F4 (instead of receiving the signal provided by multiplexer 805). Similarly, multiplexers 822 and 823 (FIG. 8) can be directly connected to receive the input signals G2 and G3, respectively (instead of receiving the signals provided by multiplexers 806 and 807, respectively). In another embodiment, where it is desirable to provide another function of the input signals when a 4 to 1 multiplexer is being implemented, additional logic output lines can be provided so that the function generators F and G and the 4 to 1 multiplexers can provide concurrent output signals. Thus, the invention is limited only by the following claims.

What is claimed is:

1. A configurable logic block (CLB) for a field programmable gate array (FPGA) comprising:

a function generator coupled to receive a first signal, a second signal and third signal, wherein the function generator provides an output signal in response to the first, second and third signals; and a first multiplexer coupled to receive the output signal, the first signal, the second signal and a logic zero signal, wherein the first multiplexer is controlled to pass a selected one of the output signal, the first signal, the second signal and the logic zero signal in response to a first control signal and a second control signal.

2. The CLB of claim 1, wherein the first signal is a first multiplier bit, the second signal is a second multiplier bit, the third signal is a carry signal, the output signal is a sum signal, the first control signal is a first multiplicand bit and the second control signal is a second multiplicand bit.

3. The CLB of claim 1, wherein the first multiplexer is coupled to receive the same input signals as the function generator.

4. The CLB of claim 1, further comprising a second multiplexer coupled to receive the output signal and an input signal to the CLB, wherein the second multiplexer is programmable to route either the output signal or the input signal to the first multiplexer.

5. The CLB of claim 1, further comprising a third multiplexer coupled to receive the third signal and the logic zero signal, wherein the third multiplexer is programmable to route either the third signal or the logic zero signal to the first multiplexer.

6. The CLB of claim 5, further comprising a fourth multiplexer coupled to receive the third signal and an input signal to the CLB, wherein the fourth multiplexer is programmable to route either the third signal or the input signal to the function generator and the third multiplexer.

7. The CLB of claim 1, wherein the function generator is configured to emulate a first exclusive OR gate having a first input terminal, a second input terminal and an output terminal, and a second exclusive OR gate having a first input terminal, a second input terminal and an output terminal, wherein the output terminal of the first exclusive OR gate is coupled to the first input terminal of the second exclusive OR gate, and wherein the first and second input terminals of the first exclusive OR gate and the second input terminal of the second exclusive OR gate are coupled to receive the first, second and third signals.

8. The CLB of claim 1, further comprising a fifth multiplexer coupled to the function generator and the first multiplexer, wherein the fifth multiplexer is programmable to route to a CLB output terminal either the output signal or a signal passed by the first multiplexer.

9. The CLB of claim 1, further comprising carry logic coupled to receive the first, second, and third signals, wherein the carry logic provides a carry output signal in response to the first, second, and third signals.

10. A configurable logic block (CLB) for a field programmable gate array (FPGA) comprising:

a function generator configured to receive a first signal, a second signal, a third signal and a fourth signal, wherein the function generator is programmable to provide a function generator output signal in response to the first, second, third and fourth signals;

a first multiplexer coupled to receive the third signal and the output signal of the function generator, the first multiplexer being programmable to pass either the third signal or the output signal as a fifth signal;

a second multiplexer coupled to receive the fourth signal and a logic low signal, the second multiplexer being programmable to pass either the fourth signal or the logic low signal as a sixth signal; and a third multiplexer coupled to receive the first signal, the second signal, the fifth signal and the sixth signal, the third multiplexer being controllable to pass one of the first, second, fifth and sixth signals as a third multiplexer output signal; and a fourth multiplexer coupled to receive the function generator output signal and the third multiplexer output signal, the fourth multiplexer being programmable to route either the function generator output signal or the third multiplexer output signal to an output terminal of the CLB.

11. The CLB of claim 10, further comprising carry logic coupled to receive three of the first, second, third and fourth signals, wherein the carry logic is programmable to provide a carry output signal in response to these three signals.

12. A method of operating a configurable logic block (CLB) of a field programmable gate array (FPGA), the method comprising the steps of:

generating a sum signal with a function generator of the CLB in response to a first multiplier bit, a second multiplier bit and a first carry signal;

selectively routing one of the sum signal, the first multiplier bit, the second multiplier bit and a logic low signal through one or more multiplexers as an output signal in response to a first multiplicand bit and a second multiplicand bit.

13. The method of claim 12, further comprising the step of generating a second carry signal with carry logic of the CLB in response to the first multiplier bit, the second multiplier bit and the first carry signal.

14. The method of claim 12, further comprising the step of operating the CLB in a second mode which includes the steps of:

bypassing the function generator of the CLB; and selectively routing one of four signals through the one or more multiplexers as an output signal in response to a pair of control signals.

15. The method of claim 12, further comprising the step of operating the CLB in a third mode which includes the step of bypassing the one or more multiplexers.

* * * * *